United States Patent [19]
Yamada et al.

[11] Patent Number: 5,317,007
[45] Date of Patent: May 31, 1994

[54] HIGH-TC OXIDE SUPERCONDUCTOR AND METHOD FOR PRODUCING THE SAME

[75] Inventors: Yutaka Yamada, Kawasaki; Satoru Murase, Yokohama, both of Japan

[73] Assignee: Kabushiki Kaisha Toshiba, Kawasaki, Japan

[21] Appl. No.: 905,318

[22] Filed: Jun. 29, 1992

Related U.S. Application Data

[62] Division of Ser. No. 313,786, Feb. 23, 1989, Pat. No. 5,145,831.

[30] Foreign Application Priority Data

Feb. 24, 1988 [JP] Japan .................................. 63-39554

[51] Int. Cl.$^5$ ...................... C04B 35/00; H01B 12/06; H01L 39/12
[52] U.S. Cl. .................... 505/121; 505/782; 501/153; 501/123; 501/126; 501/127; 252/521
[58] Field of Search .................... 505/1, 782; 501/153, 501/123, 126, 127; 252/521

[56] References Cited

U.S. PATENT DOCUMENTS 4,880,771 11/1989 Cava et al. ........................ 501/126

Primary Examiner—Mark L. Bell
Assistant Examiner—C. M. Bonner
Attorney, Agent, or Firm—Foley & Lardner

[57] ABSTRACT

A high-Tc oxide superconductor including Bi, Sr, Ca, Cu, O and at least one of Pb and Al, with a high critical temperature than that of liquid nitrogen. A method for producing the high-Tx oxide superconductor is also disclosed, in which $Bi_2O_3$, $SrCO_3$, $CaCO_3$, CuO and PbO or $Al_2O_3$ powders are mixed, calcined, ground, cold-pressed and sintered. The calcined mixture may be melted and annealed to obtain a tape-form superconductor.

6 Claims, 10 Drawing Sheets $(Bi_{1-x}Pb_x)_2Sr_2Ca_2Cu_3O_y$ $(Bi_{0.8}Pb_{0.2})_2Sr_xCa_2Cu_3O_y$ $(Bi_{0.8}Pb_{0.2})_2Sr_2Ca_xCu_3O_y$ Tc=10K $(Bi_{0.8}Pb_{0.2})_2Sr_2Ca_2Cu_xO_y$ Insulator

HIGH-TC OXIDE SUPERCONDUCTOR AND METHOD FOR PRODUCING THE SAME

This application is a division, of application Ser. No. 07/313,786, filed Feb. 23, 1989, now U.S. Pat. No. 5,145,831.

BACKGROUND OF THE INVENTION

1. Field of the Invention

The present invention relates to a high-Tc oxide superconductor of a Bi-Sr-Ca-Cu-O system and a method for producing the high-Tc oxide superconductor.

2. Description of the Background Art

In a conventional oxide superconductor of a Y-Ba-Cu-O system, its critical temperature Tc, at which the resistance becomes completely zero, is relatively high such as up to 90 K. However, in order to obtain high and good characteristics, it is necessary to set a composition ratio of Y:Ba:Cu to exactly 1:2:3, and it is quite difficult to control this composition ratio. Further, this superconductor is unstable and readily reacts with water or carbon dioxide to deteriorate its characteristics, and thus changes with the passage of time in the air. That is, this unstable superconductor must be handled carefully, e.g., it must be stored apart from the air.

An oxide superconductor of a Bi-Sr-Ca-Cu-O system having a relatively high critical temperature Tc has been proposed. However, in actual, it is difficult to determine its producing conditions, and the obtained superconductor is liable to separate into two phases. Its zero resistance temperature is 75 K. at most, and hence none of such superconductors operates in stable at temperature 77 K. of liquid nitrogen. Accordingly, the application fields of the conventional superconductors are largely restricted.

SUMMARY OF THE INVENTION

It is therefore an object of the present invention to provide a high-Tc oxide superconductor having a high critical temperature Tc higher than 77 K. of liquid nitrogen and having stable characteristics, which is capable of being applicable to a variety of fields.

It is another object of the present invention to provide a method for producing a high-Tc oxide superconductor having a high critical temperature Tc higher than 77 K. of liquid nitrogen and having stable characteristics such as high onset Tc and high offset Tc (zero resistance temperature).

In accordance with one aspect of the invention, there is provided an oxide superconductor including Bi, Sr, Ca, Cu, O and at least one of Pb and Al. A composition ratio of at least one of Pb and Al to Bi is preferably in a range of 5:95 to 85:15.

In accordance with another aspect of the invention, there is provided a method for producing a high-Tc oxide superconductor, comprising the steps of mixing appropriate amounts of $Bi_2O_3$, $SrCO_3$, $CaCO_3$, CuO and at least one of PbO and $Al_2O_3$ to obtain a mixture, calcining the mixture, grinding and then cold-pressing the calcined mixture and sintering the pressed mixture.

In accordance with still another aspect of the invention, there is provided a method for producing a superconductor, comprising the steps of mixing appropriate amounts of $Bi_2O_3$, $SrCO_3$, $CaCO_3$, CuO and at least one of PbO and $Al_2O_3$ to obtain a mixture, calcining the mixture, melting the calcined mixture to obtain a melted material and annealing the melted material at a temperature below the melting point of the melted material.

BRIEF DESCRIPTION OF THE DRAWINGS

These and other objects, features and advantages of the present invention will more fully appear from the following description of the preferred embodiments thereof with reference to the accompanying drawings, in which.

DESCRIPTION OF THE PREFERRED EMBODIMENTS

Figure 1:
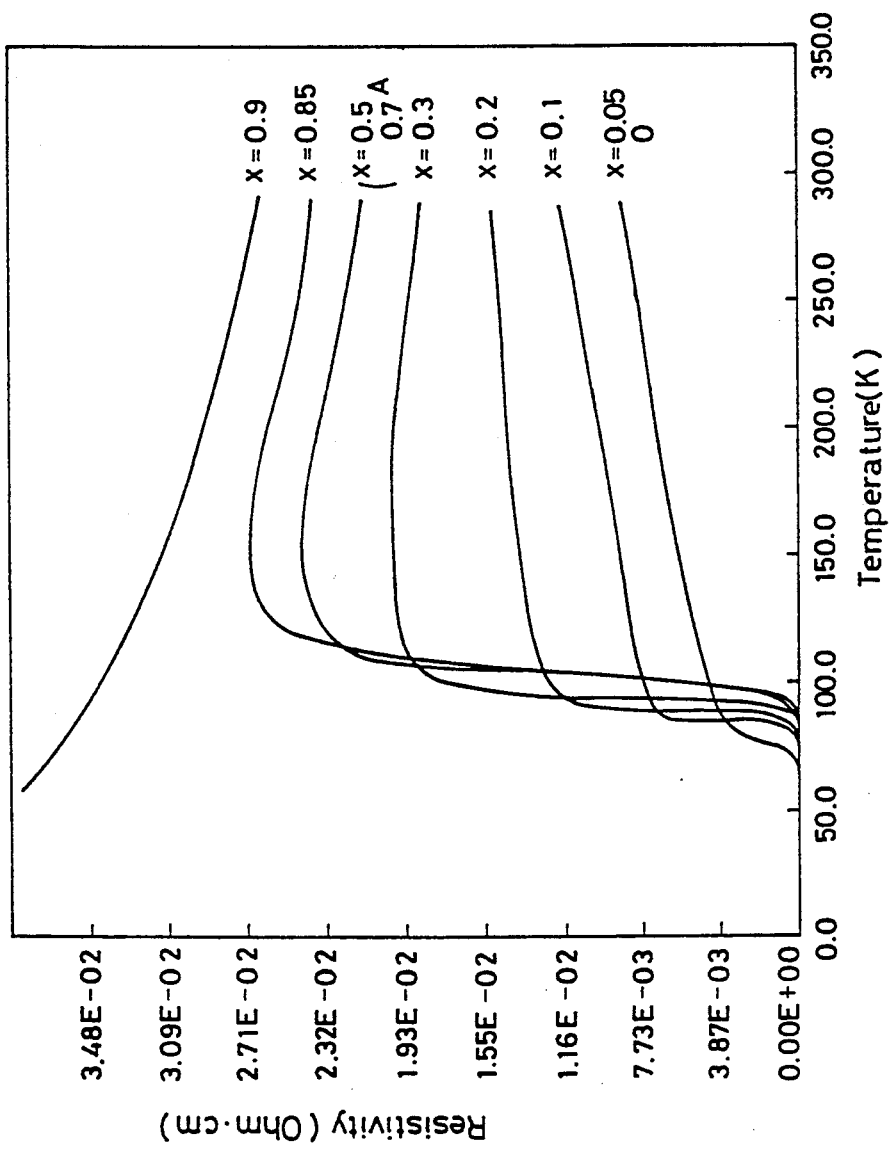
FIGS. 1 to 3 are graphical representations showing a relation between resistivity and temperature of superconductors according to the present invention.

The present invention will now be described in connection with preferred embodiments thereof with reference to the accompanying drawings.

High-Tc superconductors according to the present invention are stable oxides of Bi-Ca-Cu-O system essentially including bismuth (Bi), strontium (Sr), calcium (Ca), copper (Cu) and oxygen (O), and also including at least one of lead (Pb) and aluminum (Al), and the critical temperatures Tc of these high-Tc oxide superconductors are increased to approximately 83 to 95 K. higher than 77 K. of the liquid nitrogen. The composition ratio of at least one of Pb and Al to Bi is in a range of 5:95 to 85:15, and more preferably 10:90 to 60:40. Out of this ratio range, the critical temperature Tc is lowered.

The superconductor of the present invention includes at least one composition of the following formulas:

$(BiPb)_2Sr_2Ca_1Cu_2O_y$,
$(BiAl)_2Sr_2Ca_1Cu_2O_y$,
$(BiPb)_2Sr_2Ca_2Cu_3O_y$ and
$(BiAl)_2Sr_2Ca_2Cu_3O_y$.

In these four formulas, upper two are formed in a low-Tc phase, and y of $O_y$ is $8+\delta$ ($\delta=0$ to 1.0), whereas lower two are formed in a high-Tc phase, and y of $O_y$ is $10+\delta$ ($\delta=0$ to 1.0). The value $\delta$ is varied depending on the heat treatment conditions.

According to the present invention, the superconductor is produced from a powder mixture of appropriate amounts of $Bi_2O_3$, $SrCO_3$, $CaCO_3$, CuO and at least one of PbO and $Al_2O_3$, and the powder mixture includes at least one composition of the following formulas:

$(Bi_{1-x}Pb_x)Sr_aCa_bCu_cO_y$,
$(Bi_{1-x}Al_x)Sr_aCa_bCu_cO_y$, $(Bi_{1-x}Pb_x)_2Sr_aCa_bCu_cO_y$ and
$(Bi_{1-x}Al_x)_2Sr_aCa_bCu_cO_y$,
wherein a=1 to 5.0; b=1 to 3.5; c=1 to 4.5 and x=0.05 to 0.85. These four formulas show only starting mixture compositions obtained by mixing the oxides $Bi_2O_3$, $SrCO_3$, $CaCO_3$, CuO and PbO or $Al_2O_3$, and thus only the suffixes of the positive ions are determined.

The superconductor of the present invention is produced as follows.

Appropriate amounts of $Bi_2O_3$, $SrCO_3$, $CaCO_3$, CuO and at least one of PbO and $Al_2O_3$ powders are mixed so as to satisfy the formula described above to prepare powder mixtures in a first step. The mixtures are calcined at approximately 750° to 900° C. in the air in a second step, and the calcined mixtures are ground and then cold-pressed in a third step. The pressed mixtures are sintered at approximately 750° to 900° C. in the air to obtain pellets in a fourth step. A bar-shaped specimen of $1 \times 3 \times 20$ mm$^3$ is cut out from each pellet, and electrical resistivity of each specimen with respect to temperature variation is measured by the standard four-probe method to obtain critical temperature Tc, onset Tc and offset Tc (zero resistance temperature). The critical temperatures of the obtained specimens are higher than that of the liquid nitrogen. In one preferred embodiment, the calcining and sintering are carried out at approximately 820° to 870° C. in the air.

In this case, as to the calcining and sintering temperature, when the temperature is lower than 750° C., the critical temperature of the specimen is lowered, and when the temperature is higher than 900° C., nonsuperconducting phases dominated the pellet and the superconductor having excellent characteristics can not be obtained.

In this embodiment, the sintering or heat treatment is carried out in the air at an oxygen partial pressure of 1/5 or 20%, however, when the heat treatment is conducted in the reduced oxygen partial pressure atmosphere, the high-Tc phase area is effectively extended. When the speciment is heat-treated in a gas stream of oxygen of 7.7% and argon of 92.3%, the high-Tc phase is remarkably formed. This method is also effective at the reduced partial oxygen pressure of 1/100 or 1%.

The specimen is ground and its X-ray diffraction analyses is conducted to obtain an X-ray diffraction pattern which shows a high-Tc phase of $(BiPb)_2Sr_2Ca_2Cu_3O_y$ is formed in an almost single phase.

Then, the calcined mixture obtained in the second step described above is placed on a platinum (Pt) plate and is melted using an oxygen burner at a temperature of at least 900° C. which is detected by a W-Re thermocouple in a third step. The melted specimens are annealed at a temperature below the melting points of the melted specimens in the air in a fourth step. The annealed specimens exhibit excellent characteristics such as onset Tc and offset Tc. A tapeform superconductor material can be produced according to this method, that is, an elongate material for use in superconductor magnet can be readily prepared. In this case, instead of the platinum plate, a silver (Ag), gold (Au) or palladium (Pd) plate can be used. In this embodiment, the calcined material is ground and this ground material may be used in the third step. The ground material is pressed to form a pellet and this pellet may be also used in the third step.

In the present invention, a low-Tc phase of $(BiPb)_2Sr_2Ca_1Cu_2O_y$ or $(BiAl)_2Sr_2Ca_1Cu_2O_y$ is formed and its critical temperature Tc is improved by adding Pb or Al. Further, a high-Tc phase of $(BiPb)_2Sr_2Ca_2Cu_3O_y$ is formed by the sintering to improve the critical temperature Tc.

Examples of the present invention will now be described.

EXAMPLE 1

Appropriate amounts of $Bi_2O_3$, PbO, $SrCO_3$, $CaCO_3$, CuO powders were mixed so as to satisfy a formula $(Bi_{1-x}Pb_x)Sr_1Ca_1Cu_2O_y$, x=0, 0.05, 0.1, 0.2, 0.3, 0.5, 0.7, 0.85 and 0.9, to prepare 10 powder mixtures in a first step. The mixtures were calcined at 850° C. for 12 hours in the air in a second step, and the calcined mixtures were ground and then cold-pressed in a third step. The pressed mixtures were sintered at about 880° C. for 12 hours in the air to obtain 10 pellets in a fourth step. A bar-shaped specimen of $1 \times 3 \times 20$ mm$^3$ was cut out from each pellet, and electrical resistivity of each specimen with respect to temperature variation was measured by the standard four-probe method to obtain results shown in FIG. 1. In this case, the specimens A (x=0.5 and 0.7) had a highest critical temperature Tc, and their onset Tc and offset Tc (zero resistance temperature) were 110 K. and 90 K., respectively. It was confirmed that the critical temperatures of other specimens were somewhat lower than that of the specimens A but higher than that of the liquid nitrogen.

On the other hand, specimens including no Pb prepared in the same manner as those of Example 1 had low offset Tc such as 77 K. The $Pb_1Sr_1Ca_1Cu_1O_y$ (x=1) was insulator.

EXAMPLE 2

Figure 2:
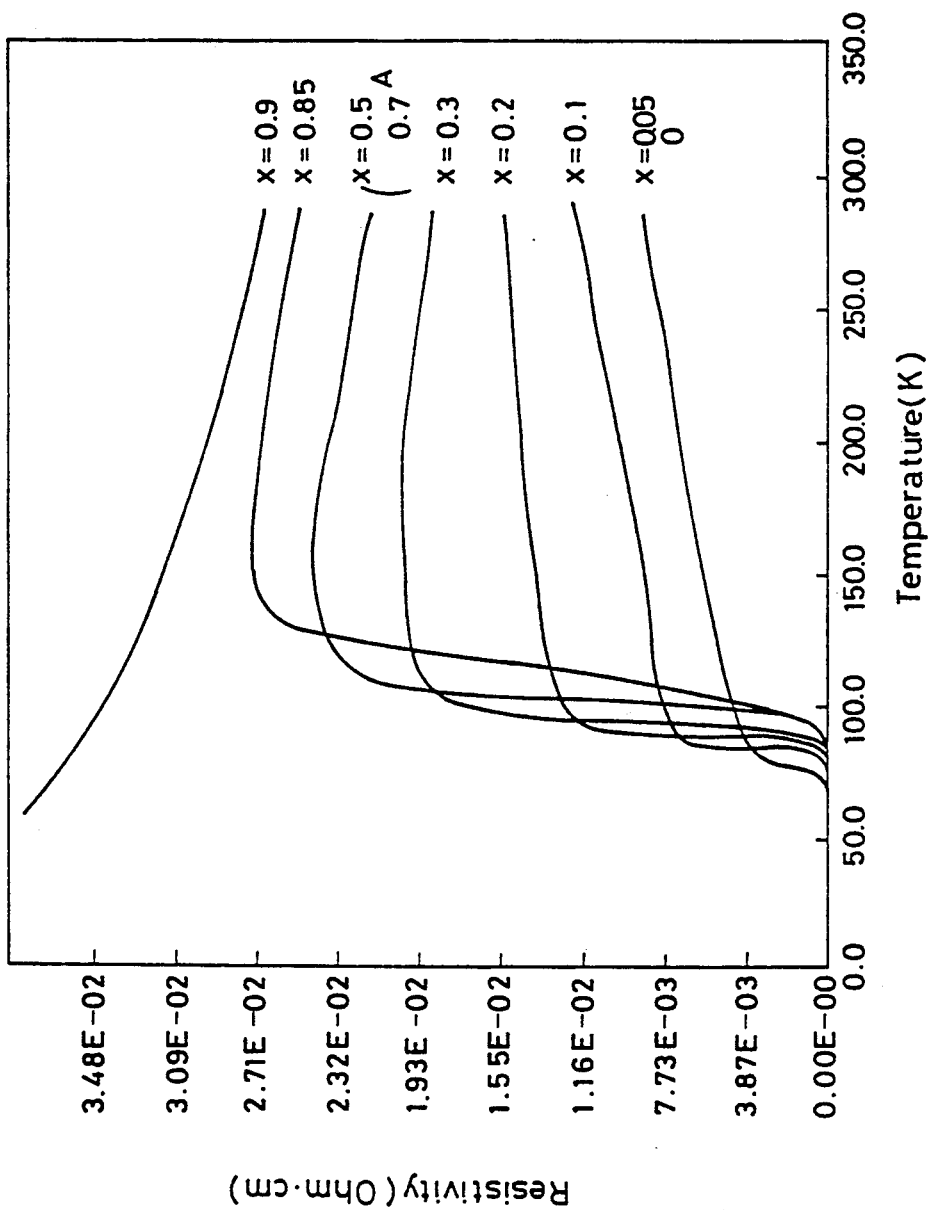

Appropriate amounts of $Bi_2O_3$, $Al_2O_3$, $SrCO_3$, CuO powders were mixed so as to satisfy a formula $(Bi_{1-x}Al_x)Sr_1Ca_1Cu_2O_y$, x=0, 0.05, 0.1, 0.2, 0.3, 0.5, 0.7, 0.85 and 0.9, to prepare 10 powder mixtures in a first step. The mixtures were calcined at 850° C. for 12 hours in the air in a second step, and the calcined mixtures were ground and then cold-pressed in a third step. The pressed mixtures were sintered at about 880° C. for 12 hours in the air to obtain 10 pellets in a fourth step. A bar-shaped specimen of $1 \times 3 \times 20$ mm$^3$ was cut out from each pellet, and electrical resistivity of each specimen with respect to temperature variation was measured by the standard four-probe method to obtain results shown in FIG. 2. In this case, the specimens A (x=0.5 and 0.7) had a highest critical temperature Tc, and their onset Tc and offset Tc (zero resistance temperature) were 110K and 90 K., respectively. It was confirmed that the critical temperatures of other specimens were somewhat lower than that of the specimens A but higher than that of the liquid nitrogen.

On the other hand, specimens including no Al prepared in the same manner as those of Example 2 had low offset Tc such as 77 K. The $Al_1Sr_1Ca_1Cu_1O_y$ (x=1) was an insulator.

EXAMPLE 3

Figure 3:
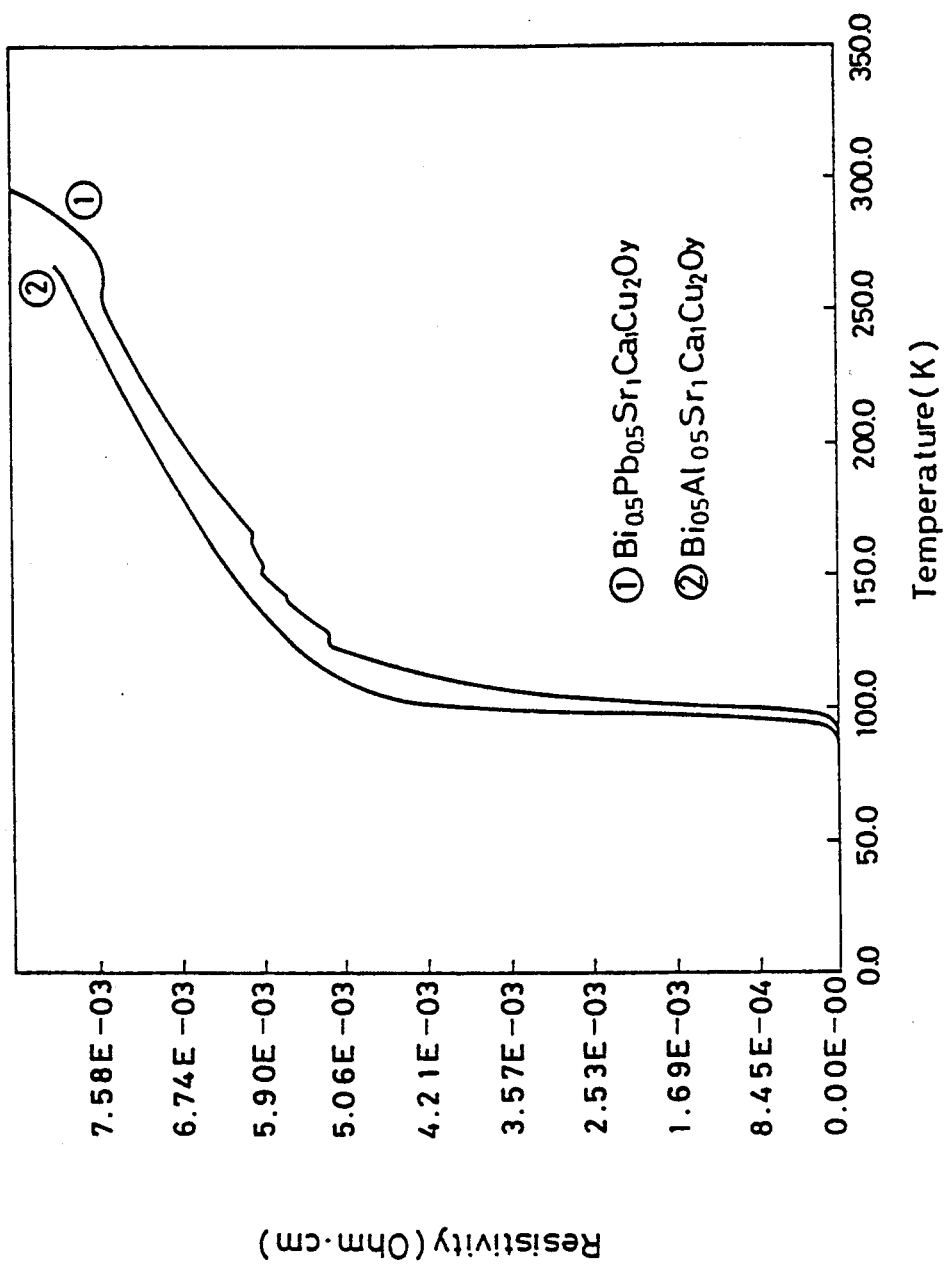

Appropriate amounts of $Bi_2O_3$, PbO, $SrCO_3$, $CaCO_3$, CuO powders were mixed so as to satisfy a formula $(Bi_{0.5}Pb_{0.5})Sr_1Ca_1Cu_2O_y$ and appropriate amounts of $Bi_2O_3$, $Al_2O_3$, $SrCO_3$, $CaCO_3$, CuO powders were mixed so as to satisfy a formula $(Bi_{0.5}Al_{0.5})Sr_1Ca_1Cu_2O_y$ to prepare powder mixtures in a first step. The mixtures were calcined at 850° C. for 12 hours in the air in a second step. The calcined mixtures were placed on a platinum (Pt) plate and were melted using an oxygen burner at 1300° C. which was detected by a W-Re thermocouple in a third step. The melted specimens were annealed at a temperature below the melting points of the melted specimens such as 880° C. for 5 hours in the air in a fourth step to obtain results shown in FIG. 3. Both the annealed specimens exhibited excellent characteristics such as onset Tc of 110 to 120 K. and offset Tc of 90 K. A tape-form superconductor material having a length of 100 cm, a width of 1 cm and a thickness of 20 μm could be produced according to this method, that is, an elongate material for use in superconductor magnet can be readily prepared. In this case, instead of the platinum plate, a silver (Ag), gold (Au) or palladium (Pd) plate could be used.

EXAMPLE 4

Figure 4:
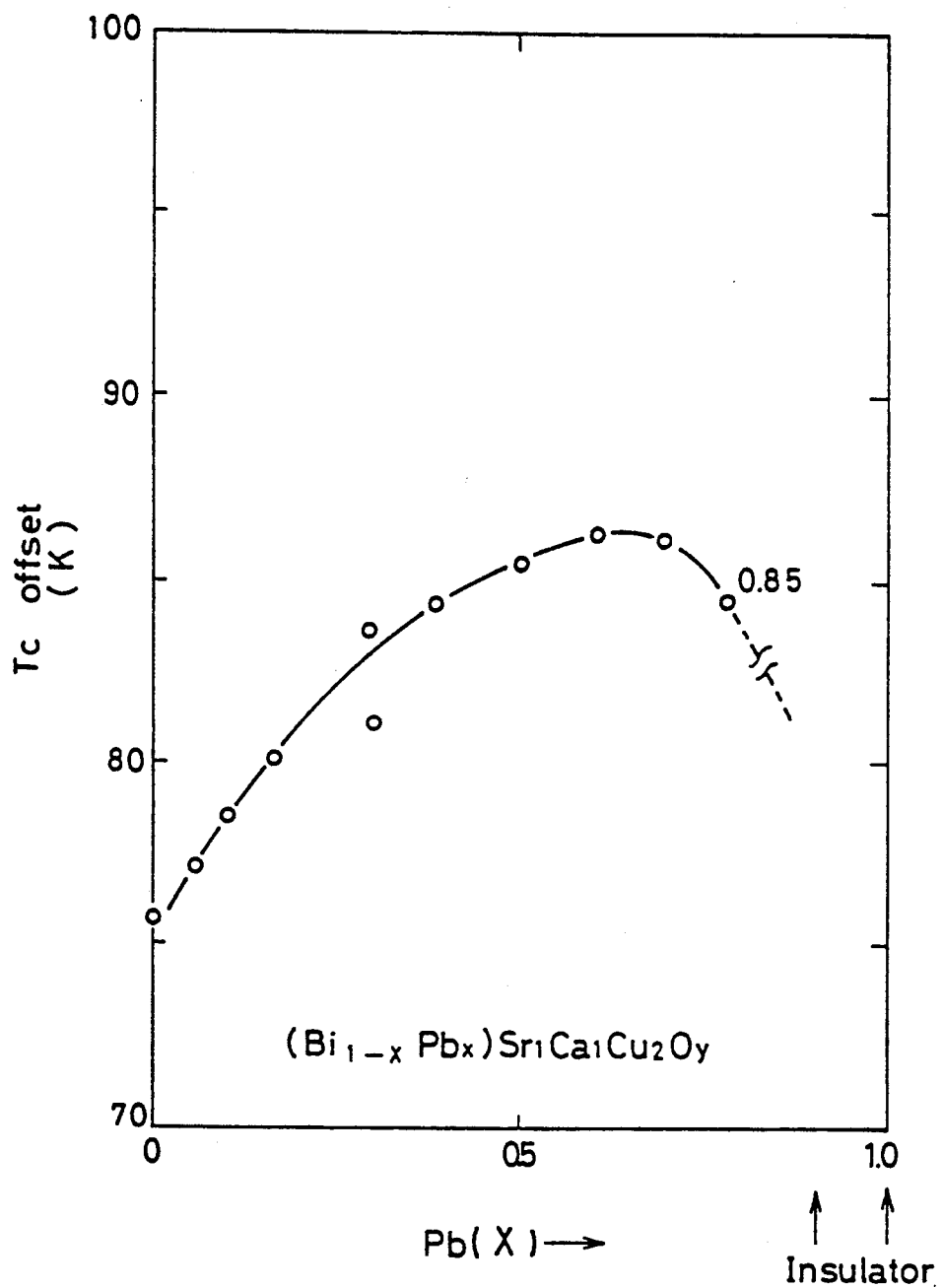
FIG. 4 is a graphical representation showing a relation between offset Tc and Pb amount of another superconductor according to the present invention.

Powder mixtures were prepared at a starting formula $(Bi_{1-x}Pb_x)Sr_1Ca_1Cu_2O_y$ in the same manner as Example 1, except that the amount of Pb was varied in a range of $x=0$ to 1 and that mixtures were calcined at 800° C. for 12 hours in the air in a second step and were sintered at 880° C. for 12 hours in the air in a fourth step to obtain results shown in FIG. 4. When $x=0.05$ to 0.85, the high offset Tc was obtained.

EXAMPLE 5

Figure 5:
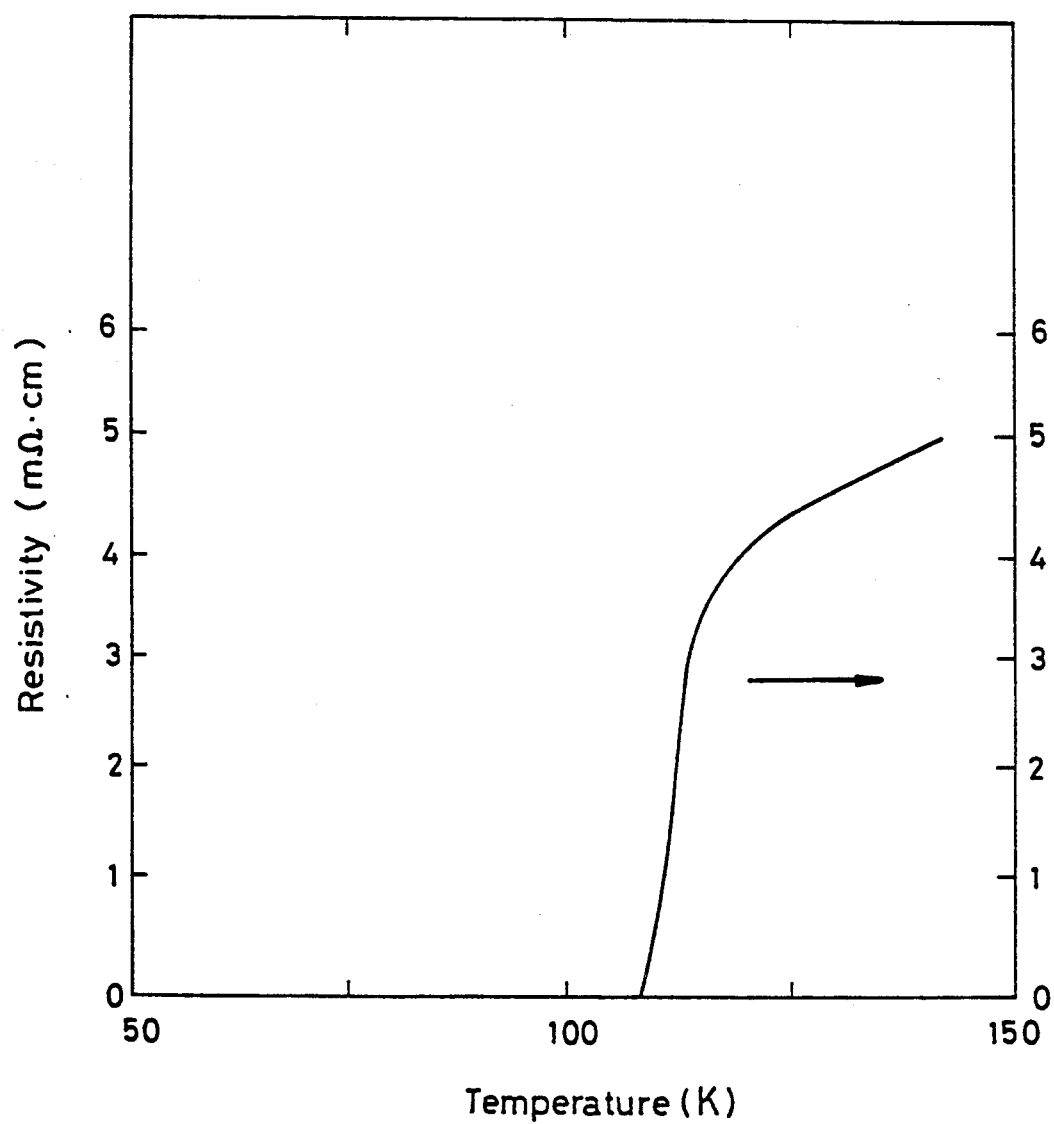
FIG. 5 is a graphical representation showing a relation between resistivity and temperature of another superconductor according to the present invention.
Figure 6:
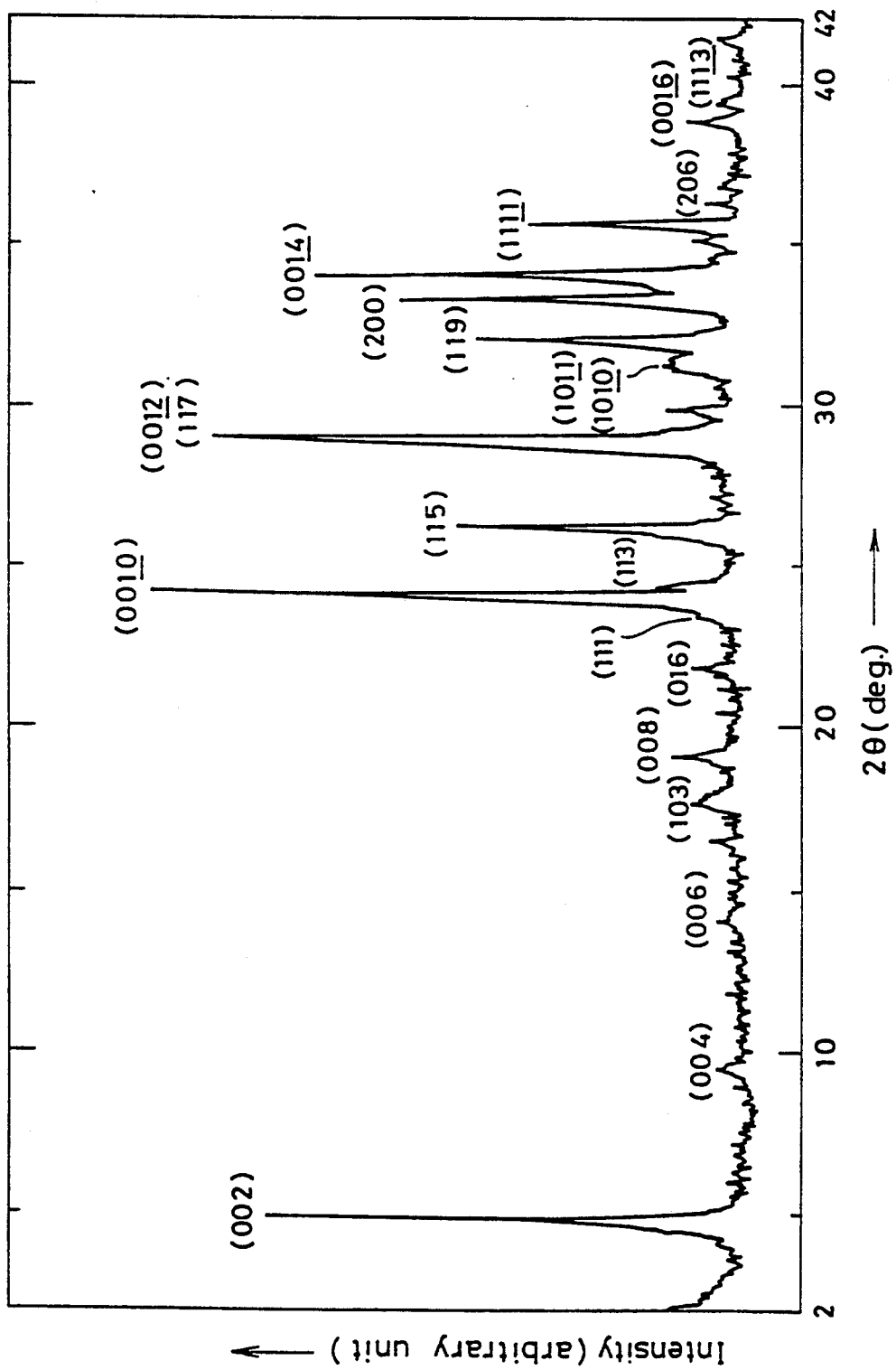
FIG. 6 is a graphical representation showing an X-ray diffraction pattern of the superconductor shown in FIG. 5.

Appropriate amounts of $Bi_2O_3$, PbO, $SrCO_3$, $CaCO_3$, CuO powders were mixed so as to satisfy a formula $(Bi_{0.8}Pb_{0.2})_2Sr_2Ca_2Cu_3O_y$ to prepare a powder mixture in a first step, and this mixture was calcined at 800° C. for 12 hours in the air in a second step. The calcined mixture was ground and then cold-pressed in a third step. The pressed mixture was sintered at about 850° C. for 100 hours in the air to obtain a pellet in a fourth step. A specimen was cut out from the pellet and the critical temperature of the specimen was measured by the standard four-probe method in the same manner as Example 1 to obtain an offset temperature of 108 K., as shown in FIG. 5. This specimen was ground and its X-ray diffraction analyses was conducted to obtain an X-ray diffraction pattern shown in FIG. 6. FIG. 6 shows a high-Tc phase of $(BiPb)_2Sr_2Ca_2Cu_3O_y$ was formed in an almost single phase.

EXAMPLE 6

Figure 7:
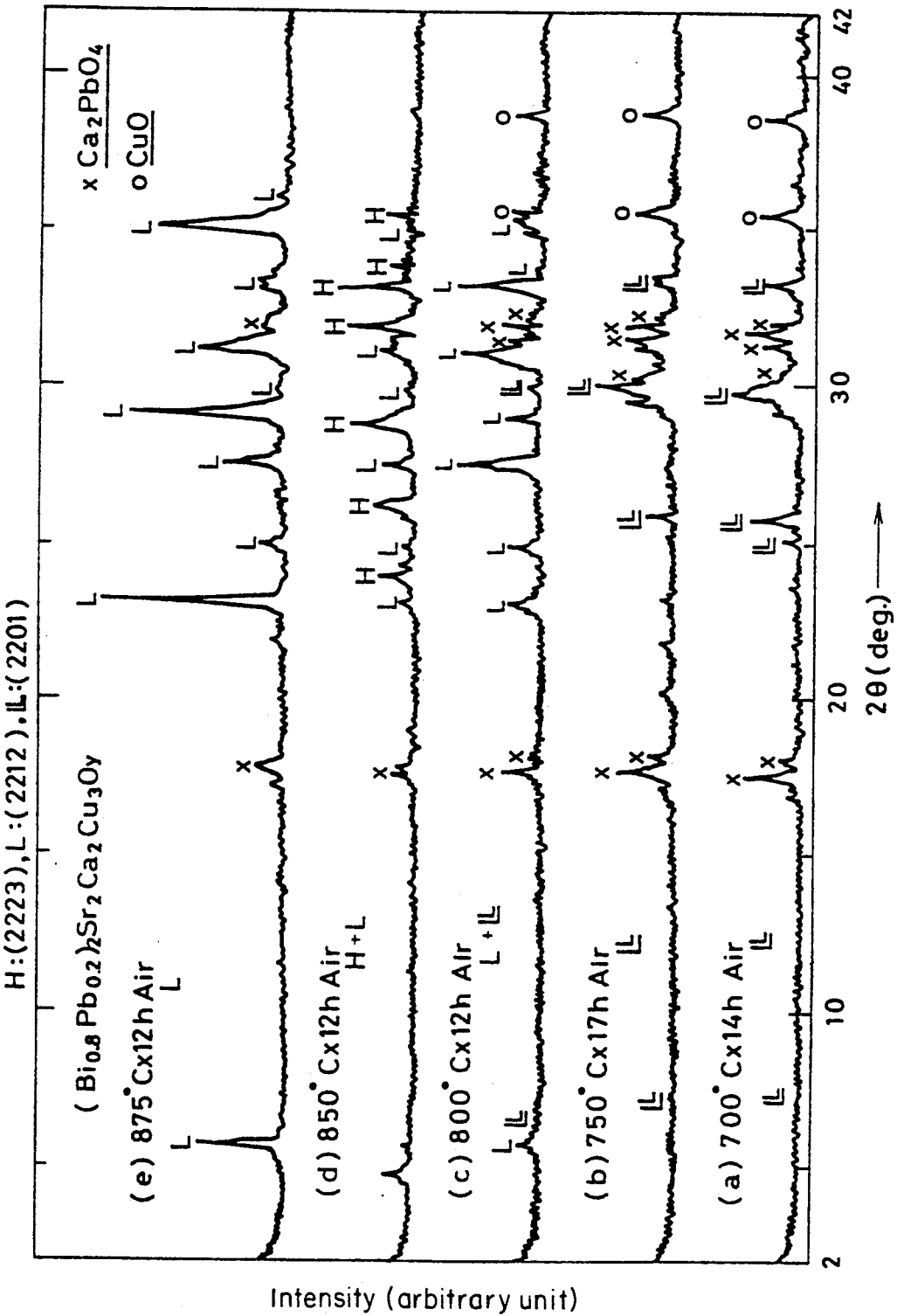
FIG. 7 is a graphical representation showing other X-ray diffraction patterns of other superconductors according to the present invention, in which a calcination temperature is varied.
Figure 8:
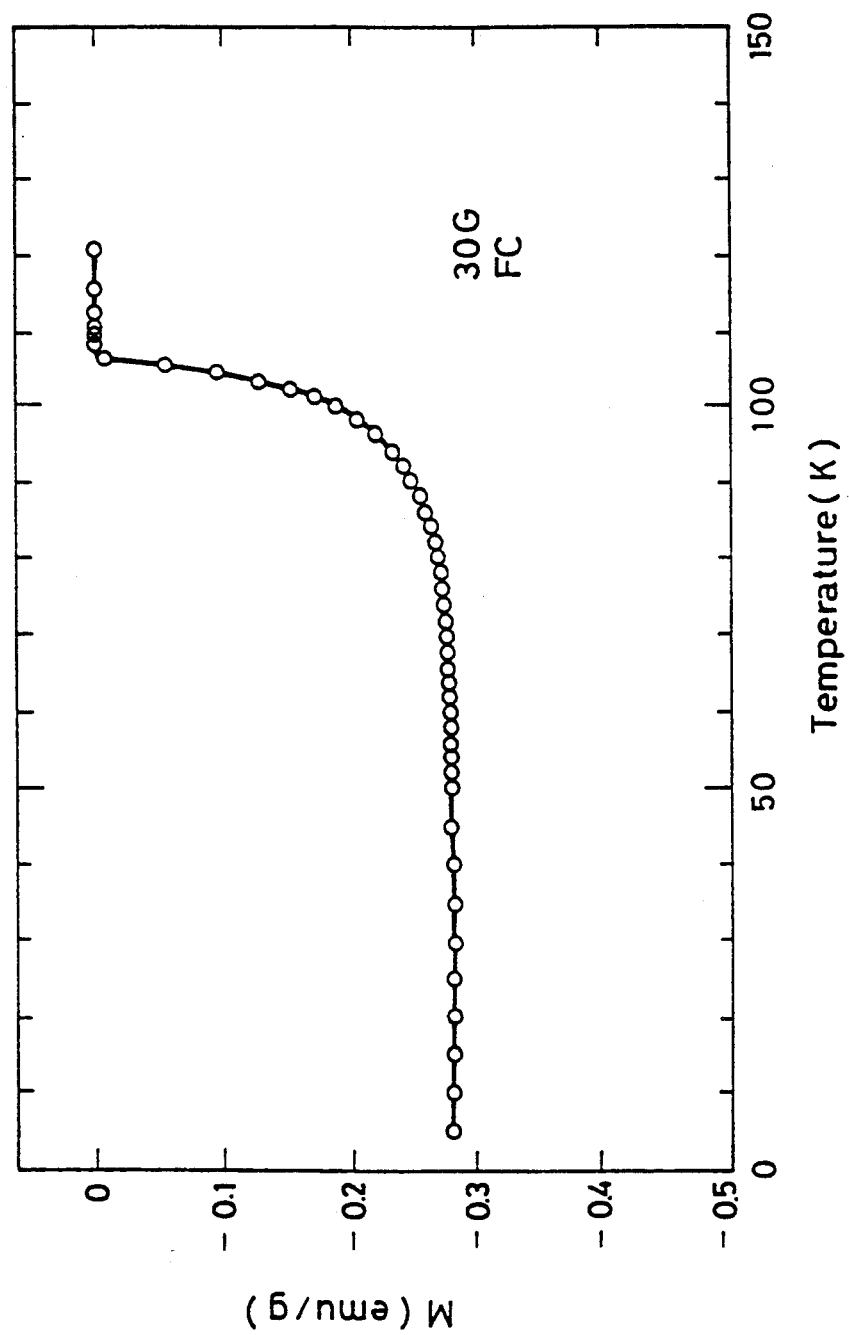
FIG. 8 is a graphical representation showing a relation between magnetization and temperature of the sample (d) in FIG. 7.

Specimens were prepared from appropriate amounts of $Bi_2O_3$, PbO, $SrCO_3$, $CaCO_3$, CuO powders to be mixed so as to satisfy the same formula $(Bi_{0.8}Pb_{0.2})_2Sr_2Ca_2Cu_3O_y$ as that of Example 5 in the same manner as Example 5, except that the mixture was sintered at different temperatures 700° to 900° C. for 12 to 17 hours in the air in a fourth step. The X-ray diffraction analyses of the specimens was carried out to obtain results shown in FIG. 7, where X-ray diffraction patterns at typical heat treatment temperatures are shown. From FIG. 7, wherein H, L and LL indicate a high-Tc phase of $(BiPb)_2Sr_2Ca_2Cu_3O_y$, a low-Tc phase of $(BiPb)_2Sr_2Ca_1Cu_2O_y$, and a lowest-Tc phase of $(BiPb)_2Sr_2Cu_1O_y$, respectively, it was found that the high-Tc phase appeared in the heat treatment at 820° to 870° C. in the air. For instance, when the heat treatment of the specimen (d) in FIG. 7 for a long time of 100 hours was carried out, a high Tc over 100 K. was obtained by the magnetization measurements, as shown in FIG. 8. In FIG. 8, the magnetization became negative at 108 K. to exhibit the Meissner effect, that is, a superconductor with a critical temperature Tc of 108 K was actually formed.

Although in the above described case, the sintering or heat treatment was carried out in the air at an oxygen partial pressure of 1/5 or 20%, however, when the heat treatment was conducted in the reduced oxygen partial pressure atmosphere, the high-Tc phase area was effectively extended. When the above specimen was heat-treated in a gas stream of oxygen of 7.7% and argon of 92.3%, the high-Tc phase was remarkably formed at 790° to 860° C. This method was effective at the reduced oxygen partial pressure of 1/100 or 1%.

EXAMPLE 7

Figure 9:
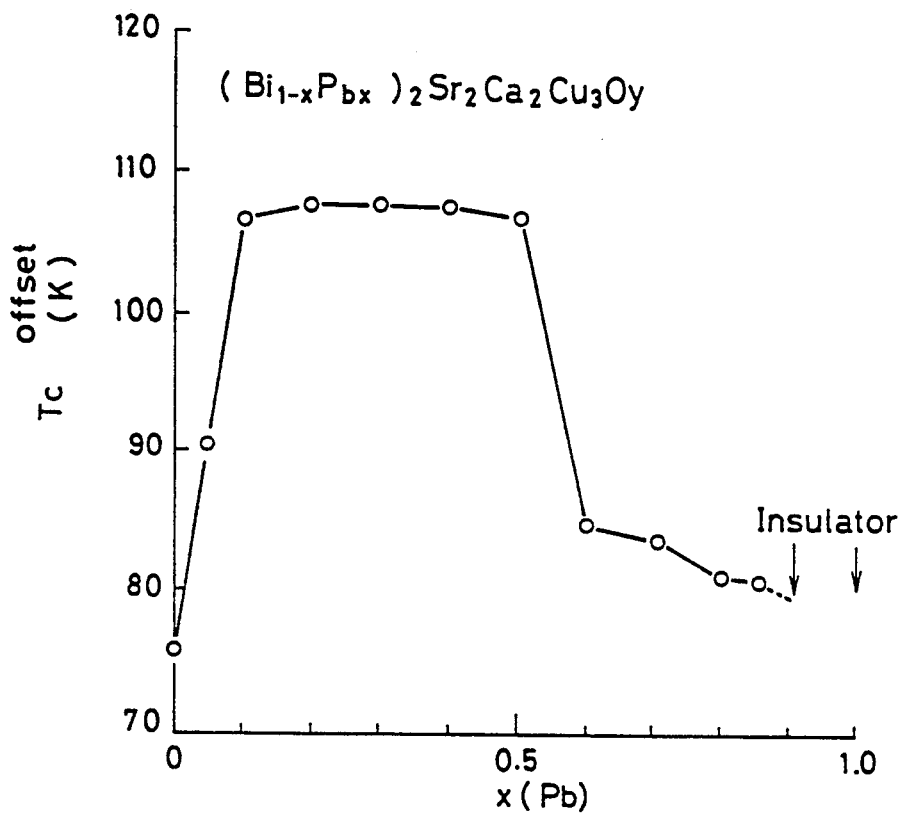
FIGS. 9 to 12 are graphical representations showing relations between offset Tc and amounts of components of other superconductors according to the present invention.

Specimens were prepared from appropriate amounts of $Bi_2O_3$, PbO, $SrCO_3$, $CaCO_3$, CuO powders to be mixed so as to satisfy a formula $(Bi_{1-x}Pb_x)_2Sr_2Ca_2Cu_3O_y$, $x=0$, 0.05, 0.1, 0.2, 0.3, 0.4, 0.5, 0.6, 0.7, 08, 0.85, 0.9 and 1.0, in the same manner as Example 5. The critical temperatures Tc of the specimens were measured by the standard four-probe method in the same manner as Example 1, as shown in FIG. 9. When $x=0.05$ to 0.85, the offset Tc was improved in virtue of the addition of Pb. When $x=0.9$ and 1.0, the specimens were the insulator with no Tc.

EXAMPLE 8

Figure 10:
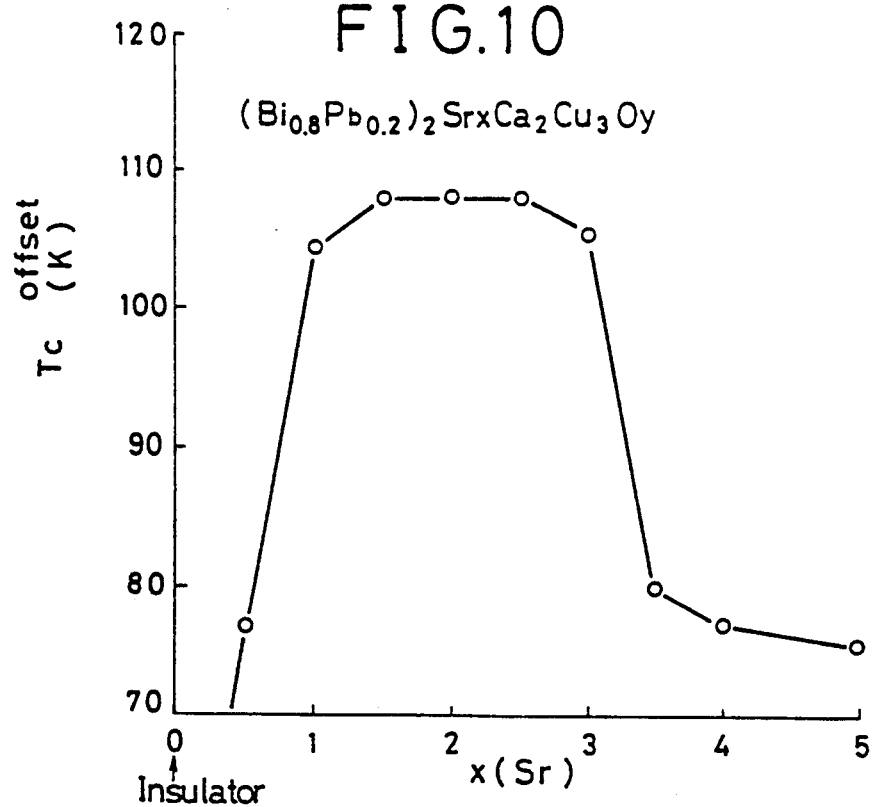

Specimens were prepared at a starting formula $(Bi_{0.8}Pb_{0.2})_2Sr_xCa_2Cu_3O_y$, $x=0$ to 7, in the same manner as Example 5, and the critical temperatures of the specimens were measured by the standard four-probe method in the same manner as Example 1 to obtain results shown in FIG. 10. When $x=0.5$ to 5, the specimens having high Tc were obtained, but when x is larger than 5, specimens showed rather low-Tc.

EXAMPLE 9

Figure 11:
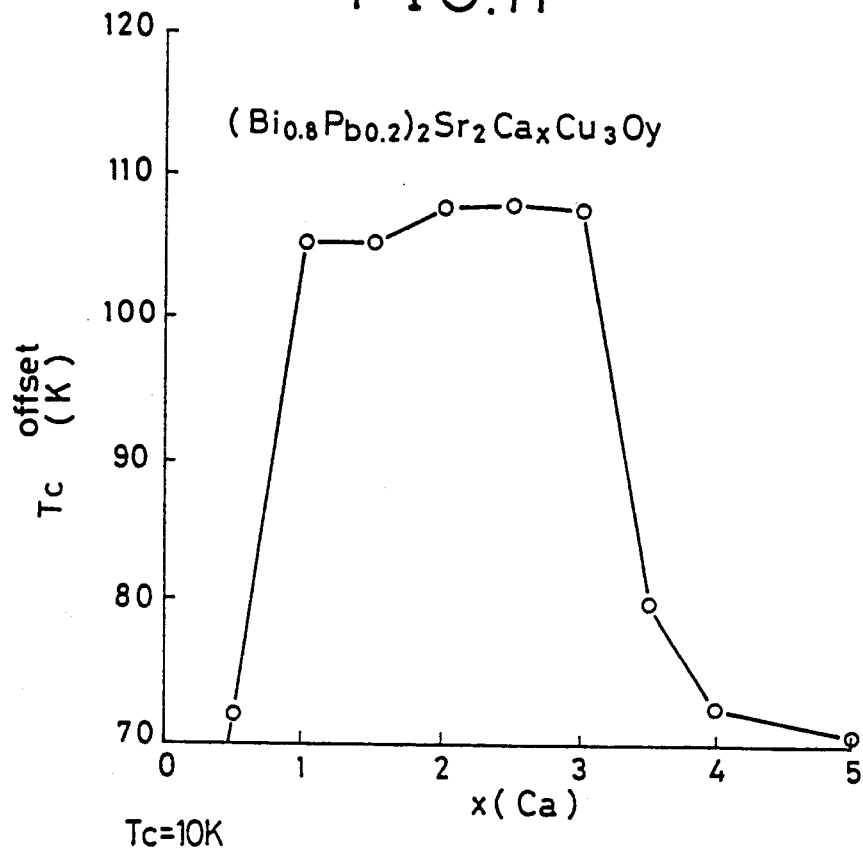

Specimens were prepared at a starting formula $(Bi_{0.8}Pb_{0.2})_2Sr_2Ca_xCu_3O_y$, $x=0$ to 7, in the same manner as Example 5, and the critical temperatures of the specimens were measured by the standard four-probe method in the same manner as Example 1 to obtain results shown in FIG. 11. When $x=1$ to 3.5, the improvement of Tc was observed as compared with the specimen including no Pb described in Example 1.

EXAMPLE 10

Figure 12:
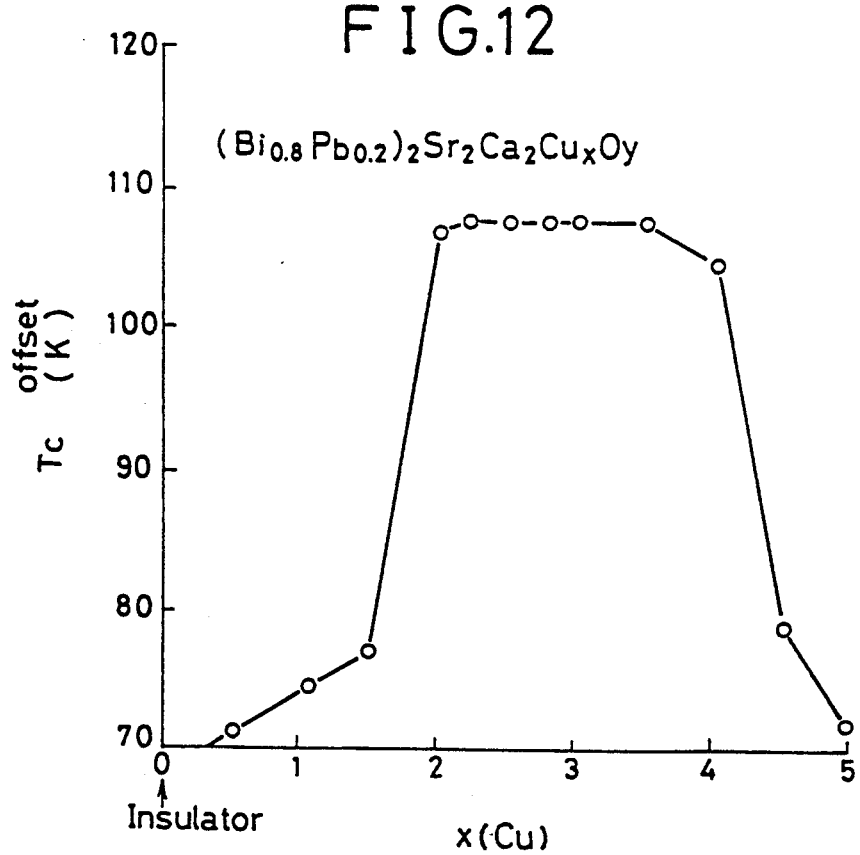

Specimens were prepared at a starting formula $(Bi_{0.8}Pb_{0.2})_2Sr_2Ca_2Cu_xO_y$, $x=0$ to 7, in the same manner as Example 5, and the critical temperatures of the specimens were measured by the standard four-probe method in the same manner as Example 1 to obtain results shown in FIG. 12. When $x=1.5$ to 4.5, the improvement of Tc was observed as compared with the specimen including no Pb described in Example 1.

In Examples 1 to 4, the low-Tc phase of $(BiPb)_2Sr_2Ca_1Cu_2O_y$ or $(BiAl)_2Sr_2Ca_1Cu_2O_y$ is formed and the critical temperature Tc of the specimen is improved by adding Pb or Al. In Examples 5 to 10, the high-Tc phase of $(BiPb)_2Sr_2Ca_2Cu_3O_y$ is formed by the sintering at a proper temperature to improve the critical temperature Tc.

As described above, it is readily understood that, according to the present invention, a high-Tc oxide superconductor of Bi-Sr-Ca-Cu-O system with an offset Tc such as 83 to 95 K. higher than 77 K. of the liquid nitrogen can be prepared by adding at least one of Pb and Al as compared with a conventional oxide superconductor of Bi-Sr-Ca-Cu-O system having no Pb or Al, and further a stable high-Tc oxide superconductor for use in various fields can be obtained. According to the present invention, a method for producing a stable high-Tc oxide superconductor of Bi-Sr-Ca-Cu-O system with an offset Tc higher than that of the liquid nitrogen can be obtained.

Although the present invention has been described in its preferred embodiments with reference to the accompanying drawings, it is readily understood that the present invention is not restricted to the preferred embodiments thereof and that various changes and modifications may be made in the present invention by those skilled in the art without departing from the spirit and scope of the present invention.

What is claimed is:

1. The cuprate oxide superconductor having a nominal composition $(Bi_{1-x}X_x)_2Sr_2Ca_2Cu_cO_{10+\delta}$ wherein X is at least one of Al and Pb, in a stoichiometric ratio in which $x=0.05$ to $0.85$, $c=1.5$ to $4.5$ and $\delta$ is 0 to 1.

2. The cuprate oxide superconductor as claimed in claim 1, having a nominal composition $(Bi_{1-x}X_x)_2Sr_2Ca_2Cu_3O_{10+\delta}$.

3. The cuprate oxide superconductor as claimed in claim 1, having a nominal composition $(Bi_{1-x}Pb_x)_2Sr_2Ca_2Cu_cO_{10+\delta}$.

4. The cuprate oxide superconductor as claimed in claim 1, having a nominal composition $(Bi_{1-x}Pb_x)_2Sr_2Ca_2Cu_3O_{10+\delta}$.

5. The cuprate oxide superconductor as claimed in claim 1, having a nominal composition $(Bi_{1-x}Al_x)_2Sr_2Ca_2Cu_cO_{10+\delta}$.

6. The cuprate oxide superconductor as claimed in claim 1, having a nominal composition $(Bi_{1-x}Al_x)_2Sr_2Ca_2Cu_3O_{10+\delta}$.

* * * * *